United States Patent [19]

Masuoka

[11] 4,437,174

[45] Mar. 13, 1984

[54] SEMICONDUCTOR MEMORY DEVICE

[75] Inventor: Fujio Masuoka, Yokohama, Japan

[73] Assignee: Tokyo Shibaura Denki Kabushiki Kaisha, Kawasaki, Japan

[21] Appl. No.: 320,937

[22] Filed: Nov. 13, 1981

[30] Foreign Application Priority Data

Jan. 19, 1981 [JP] Japan .................................. 56/6172
Jan. 19, 1981 [JP] Japan .................................. 56/6173

[51] Int. Cl.³ .......................................... G11C 11/40
[52] U.S. Cl. ................................. 365/218; 365/182
[58] Field of Search ............... 365/174, 182, 185, 218

[56] References Cited

U.S. PATENT DOCUMENTS 4,203,158  5/1980  Frohman-Bentchkowsky et al. ..................................... 365/185

OTHER PUBLICATIONS

1980 IEEE International Solid-State Circuit Conference 152, (Feb. 1980), A 16Kb Electrically Erasable Nonvolatile Memory.

Kupec et al., Triple Level Poly-Silicon E²Prom with Single Transistor per Bit 1980 IEEE.

*Primary Examiner*—Terrell W. Fears
*Attorney, Agent, or Firm*—Finnegan, Henderson, Farabow, Garrett & Dunner

[57] ABSTRACT

A semiconductor memory device consisting of memory cells each of which has an erase gate for erasing data from the floating gate thereof.

The semiconductor memory device has a circuit for applying an erase voltage of high level to the erase gate to erase data from the floating gate. The semiconductor memory device further includes a circuit for applying a predetermined potential difference between the drain and the source of a selected memory cell so as to detect a current flowing through the selected memory cell, thereby detecting the data erasure condition from the floating gate of the selected memory cell. A circuit is also included for inhibiting the application of the erase voltage upon detection of the current flowing through the memory cell.

6 Claims, 31 Drawing Figures

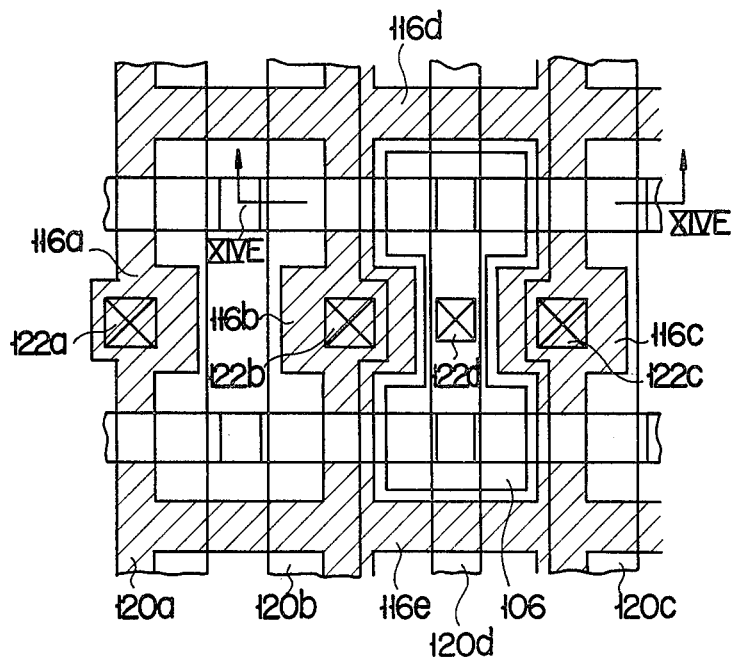
F I G. 13E

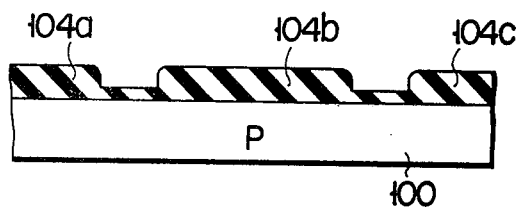
F I G. 14A
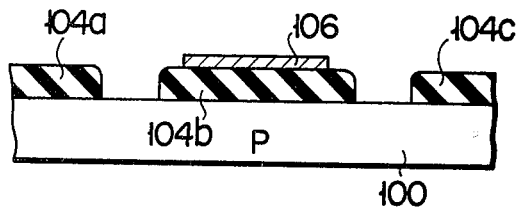
F I G. 14B
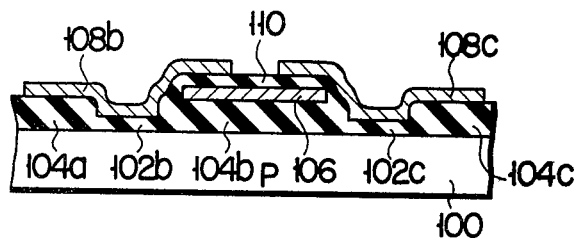
F I G. 14C
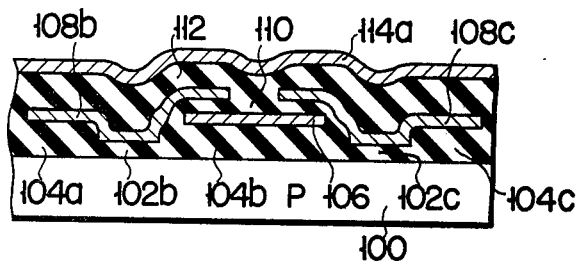
F I G. 14D
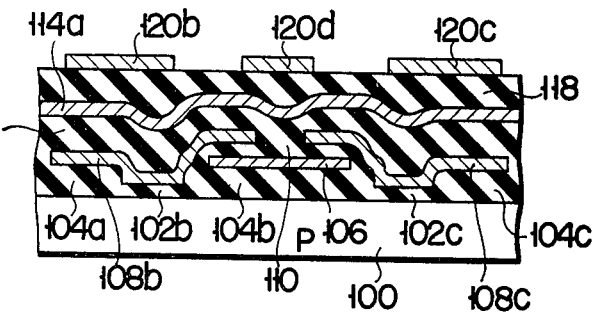
F I G. 14E

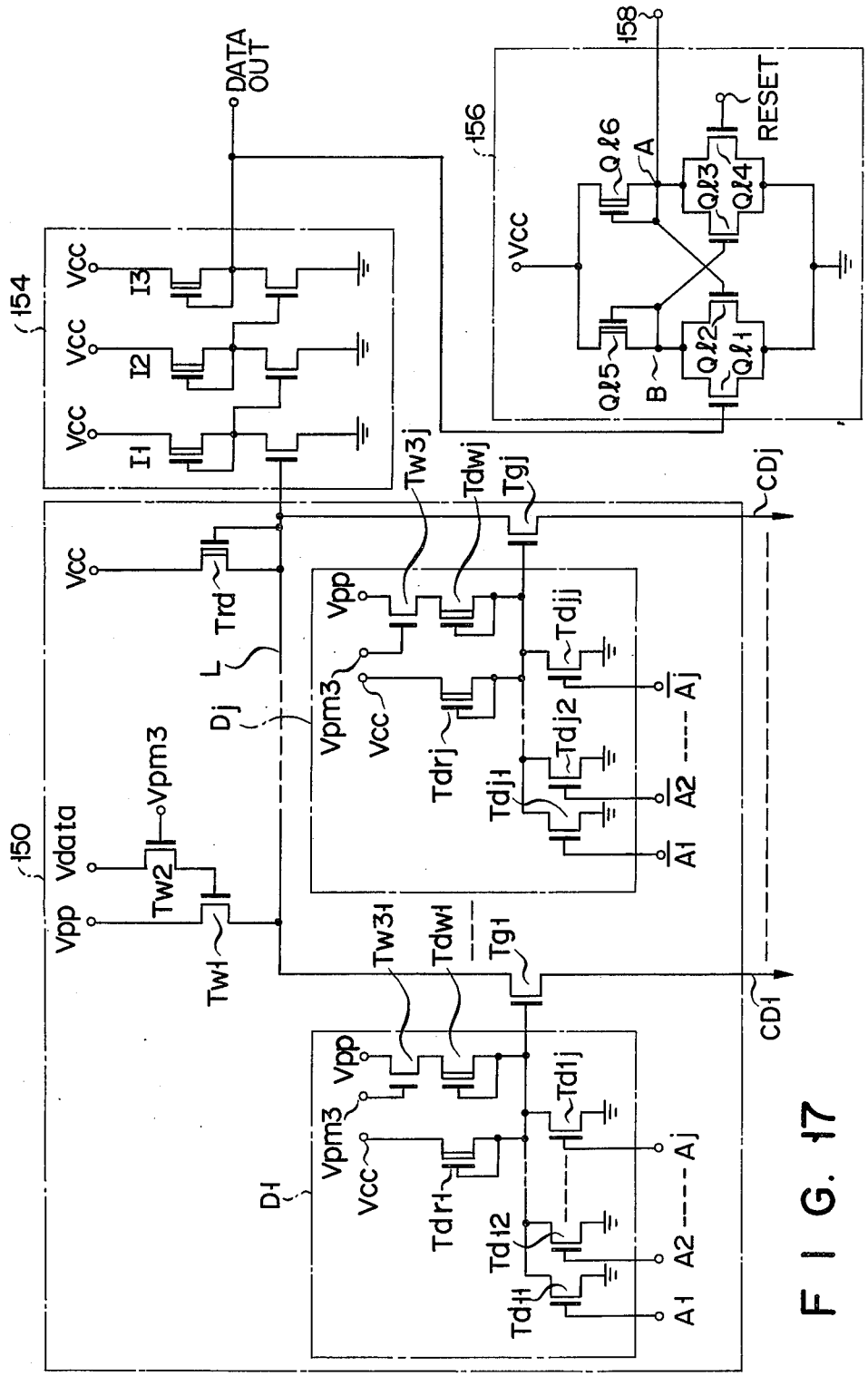
F I G. 17

SEMICONDUCTOR MEMORY DEVICE

BACKGROUND OF THE INVENTION

The present invention relates to a semiconductor memory device suitable for an electrically erasable and electrically programmable read-only memory.

Writing and erasing of data after manufacture is possible with an erasable and electrically programmable read-only memory (EP-ROM). The EP-ROMs are roughly classified into the ultraviolet ray erasable type and into the electrically erasable type. A high packaging density may be accomplished with an EP-ROM of the ultraviolet ray erasable type, since one transistor may comprise one memory cell. The ultraviolet ray erasable type EP-ROMs of 32 kbit and 64 kbit sizes have been developed so far. However, the EP-ROMs of the ultraviolet ray erasable type are defective in that manufacturing cost becomes high since a package is required which transmits the ultraviolet rays. On the other hand, a satisfactory packaging density may not be accomplished with the electrically erasable and programmable read-only memory ($E^2$P-ROM) since at least two transistors constitute one memory cell. $E^2$P-ROMs of 16 kbit have so far been developed. However, the $E^2$P-ROMs of the electrically erasable type are advantageous in that manufacturing costs may be reduced by using a less expensive plastic material for the package.

FIG. 1 is a circuit diagram of a memory cell of a conventional $E^2$P-ROM disclosed in "A 16 kb Electrically Erasable Nonvolatile Memory", ISSCC Digest of Technical Papers, 1980, Feb. pp 152 to 153 and 271 by W. S. Johnson et al. This memory cell comprises two transistors Q1 and Q2. The transistor Q1 comprises a select MOS transistor and the transistor Q2 comprises a double gate type MOS transistor having a control gate 50 and a floating gate 52. One doped region of the transistor Q1 is connected to a digit line 54, and the other doped region thereof is connected to one doped region of the transistor Q2. The gate of the transistor Q1 is connected to a select line 56. The other doped region of the transistor Q2 is grounded, and the control gate thereof is connected to a data program line 58.

The conventional $E^2$P-ROMs of the construction as described above have the following drawbacks:

(a1) As may be apparent from FIG. 1, one memory cell comprises two transistors. Therefore, the number of elements becomes twice that of the EP-ROMs of the ultraviolet ray erasable type, resulting in half the packaging density. The EP-ROMs of the electrically erasable type are inferior in the packaging density to those of the ultraviolet ray erasable type.

(a2) Voltages of both polarities of positive and negative are required for writing and erasing of data. Therefore, power sources of both polarities of positive and negative are required for mounting the $E^2$P-ROMs of this type on a printed circuit board and for electrically writing and erasing data therein.

(a3) Extra circuits are required to simultaneously erase data in units of words or all the bits, resulting in a low packaging density.

(a4) It is difficult to erase data of all the bits within a short period of time.

(a5) It is impossible to erase data with a unipolar power source of 5 V, for example.

An $E^2$P-ROM which eliminates the above drawbacks is disclosed in "Triple Level Poly-silicon $E^2$P-ROM with Single Transistor Per Bit", J. Kupec, W. M. Gosney, V. Mckenny, and V. Kowshik, IEDM, Dec. 1980, pp 602 to 606. In the paper described above, a method for preventing excessive erasure of data from the floating gate is disclosed. The present invention provides a semiconductor memory device which prevents excessive erasure of data from the floating gate by a different method from the method described in the paper.

SUMMARY OF THE INVENTION

The object of the present invention is to eliminate the conventional drawbacks described above and to provide a semiconductor memory device which prevents excessive discharging of electrons from a floating gate when data is erased.

In the semiconductor memory device according to the present invention, memory cells having erase gates for erasing data from the floating gates are arranged in a matrix form. Furthermore, a circuit for applying an erase voltage of high level to the erase gate is arranged so that data is erased from the floating gate. A circuit for detecting a current flowing through a selected memory cell by providing a predetermined potential difference between a drain and a source of the memory cell is arranged for detecting the erase condition of data from the floating gate. A circuit for prohibiting supply of the erase voltage by detecting the current as described above is also arranged.

In the semiconductor memory device with the above arrangement, since the data erase condition of the floating gate of the selected memory cell may be detected, excessive discharging of electrons from the floating gate is thus prevented.

BRIEF DESCRIPTION OF THE DRAWINGS

Other objects and advantages of the present invention will become apparent from the following detailed description when taken in conjunction with the accompanying drawings in which:

FIGS. 13A to 13E are plan views of a semiconductor substrate for explaining a method for manufacturing the second group of memory cells shown in FIG. 9;

FIGS. 14A to 14E are sectional views along the lines XIVA—XIVA, XIVB—XIVB, . . . , XIVE—XIVE, respectively, of FIGS. 13A to 13E;

FIG. 17 is a circuit diagram of a column decoder, a sense amplifier and a latch circuit of FIG. 16;

DETAILED DESCRIPTION OF THE PREFERRED EMBODIMENTS

Figure 2:
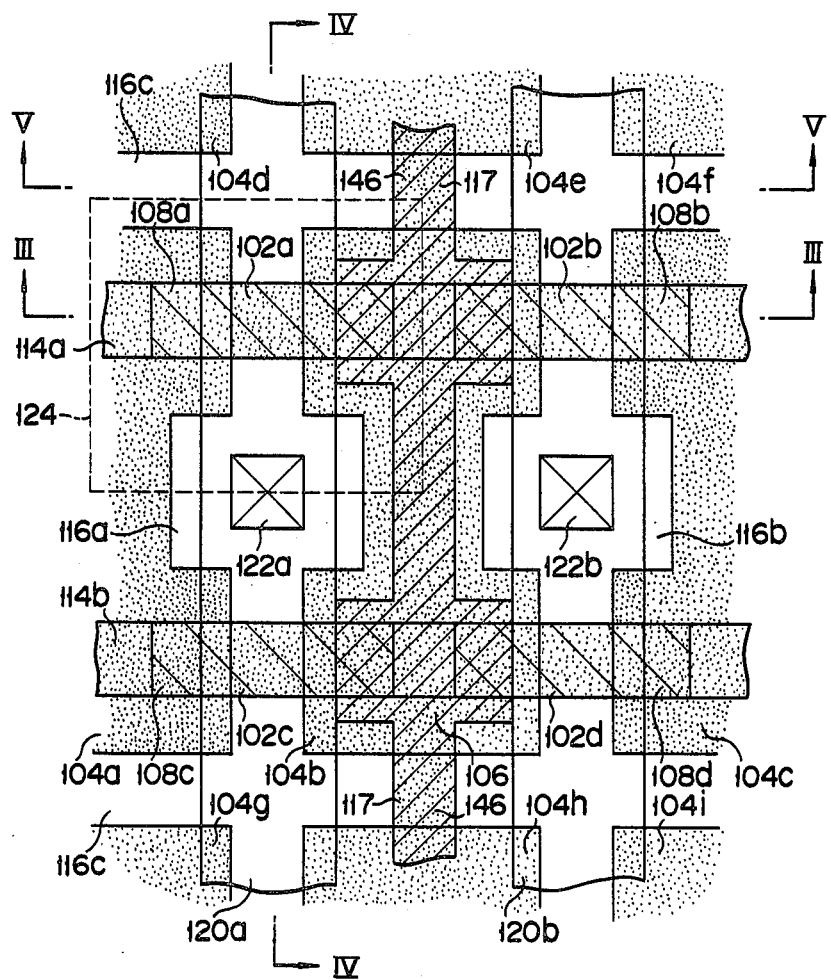
FIG. 2 is a plan view of a first group of memory cells of a semiconductor memory device according to the present invention.
Figure 3:
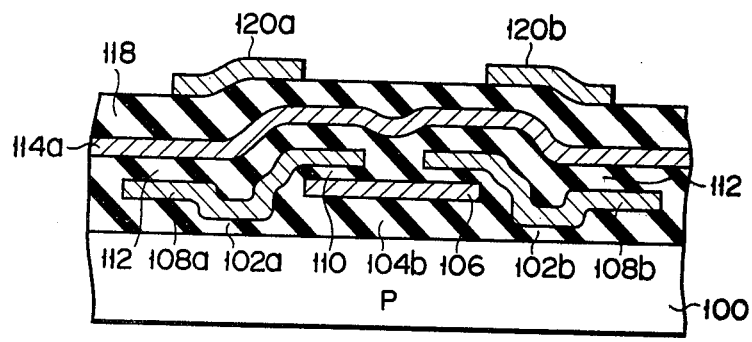
FIG. 3 is a sectional view along the line III—III of FIG. 2.
Figure 4:
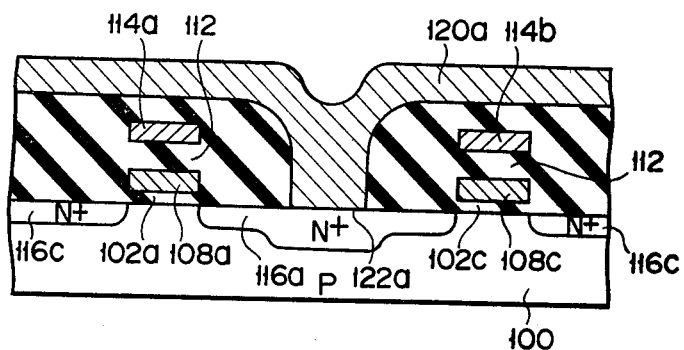
FIG. 4 is a sectional view along the line IV—IV of FIG. 2.
Figure 5:
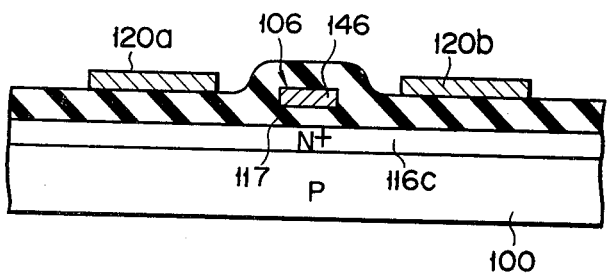
FIG. 5 is a sectional view along the line V—V of FIG. 2.

A first group of memory cells constituting a semiconductor memory device according to this invention will be described with reference to FIGS. 2 to 5. FIG. 2 is a plan view of memory cells for 4 bits, FIG. 3 is a sectional view along the line III—III of FIG. 2, FIG. 4 is a sectional view along the line IV—IV of FIG. 2, and FIG. 5 is a sectional view along the line V—V of FIG. 2. Referring to FIG. 2, the doped regions of the semiconductor substrate are indicated by the clear areas, the oxide areas are indicated by the dotted areas, and the polycrystalline silicon members are indicated by the cross-hatched areas.

Gate insulating films 102a, 102b, 102c and 102d of 500 Å thickness each are formed on the surface of a P-type semiconductor substrate 100 with equal intervals in an X-Y matrix form. On the surface of the semiconductor substrate 100 are also formed field insulating films 104a, . . . 104i. The field insulating film 104b of 1μ thickness is formed between the paired gate insulating films 102a and 102c and the paired gate insulating films 102b and 102d. A first conductive layer 106 which has a thickness of 6,000 Å and which consists of polycrystalline silicon doped with phosphorus or arsenic is formed on the field insulating film 104b. Second conductive layers 108a, 108b, 108c and 108d which have a thickness of 5,000 Å and which consist of polycrystalline silicon are formed on the gate insulating films 102a, 102b, 102c and 102d, respectively, and are separate from one another. The right edges of the second conductive layers 108a and 108c overlap the left edge of the first conductive layer 106 with an insulating film 110 of 500 Å thickness interposed therebetween. The left edges of the second conductive layers 108b and 108d overlap the right edge of the first conductive layer 106 with this insulating film 110 interposed therebetween.

A third conductive layer 114a of polycrystalline silicon is formed on the second conductive layers 108a and 108b with an insulating film 112 having a thickness of 1,000 to 2,000 Å interposed therebetween. The third conductive layer 114a has substantially the same width as those of the second conductive layers 108a and 108b.

Another third conductive layer 114b of polycrystalline silicon is formed on the other second conductive layers 108c and 108d with the insulating film 112 interposed therebetween. This third conductive layer 114b also has substantially the same width as those of the second conductive layers 108c and 108d.

An N+-type semiconductor layer 116a is formed on the surface region of the semiconductor substrate 100 disposed between the gate insulating films 102a and 102c. Another N+-type semiconductor layer 116b is formed on the surface region of the semiconductor substrate 100 disposed between the gate insulating films 102b and 102d. A continuous N+-type semiconductor layer 116c is formed on the surface region of the semiconductor substrate 100 which is opposite to the N+-type semiconductor layers 116a and 116b with respect to the gate insulating films 102a, 102b, 102c and 102d.

An insulating film 117 (FIG. 5) which has a thickness of 1,000 to 2,000 Å is formed at the part disposed between the N+-type semiconductor layer 116c and part 146 of the first conductive layer 106 which is not on the field insulating film. This insulating film 117 is so formed to have a thickness greater than those of the gate insulating films 102a to 102d.

Fourth conductive layers 120a and 120b of aluminum are formed on the third conductive layers 114a and 114b with an insulating film 118 interposed therebetween. The conductive layer 120a and the N+-type semiconductor layer 116a are connected by a contact hole 122a. The conductive layer 120b and the N+-type semiconductor layer 116b are connected by a contact hole 122b. The N+-type semiconductor layer 116c is connected to a point of reference potential, for example, a point of ground potential.

A region 124 surrounded by the broken lines in FIG. 2 shows a memory cell for 1 bit of the semiconductor memory device. As may be apparent from FIG. 3, this memory cell is a MOS transistor having the second conductive layer 108a as a floating gate, the third conductive layer 114a as a control gate, the first conductive layer 106 as an erase gate, the N+-type semiconductor layer 116a as a drain, and the N+-type semiconductor layer 116c as a source. Referring to FIG. 3, the control gate 114a is commonly used for memory cells of 2 bits, and the erase gate 106 is commonly used for the memory cells of 4 bits. A pair of memory cells having the common gate 114a are formed symmetrical about the erase gate 106. The control gate 114a is formed on the semiconductor substrate 100 with an insulating film interposed therebetween.

The floating gates 108a and 108b and the erase gate 106 are juxtaposed within the insulating film sandwiched by the control gate 114a and the semiconductor substrate 100. Since the erase gate 106 is formed on the field insulating film 104b, parts where the respective floating gates 108a and 108b and the erase gate 106 overlap are formed within the field region. At these overlapping parts, as shown in FIG. 3, the second conductive layer (floating gate) 108a is above the first conductive layer (erase gate) 106. Therefore, the distance between the semiconductor substrate 100 and the first conductive layer 106 is less than that between the semiconductor layer 100 and the second conductive layer 108a.

Figure 1:
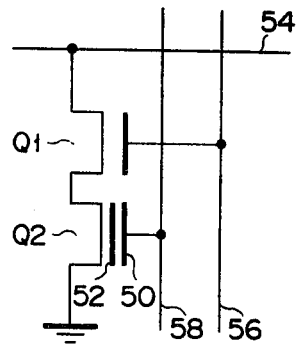
FIG. 1 is a circuit diagram of a memory cell constituting a conventional memory device.
Figure 6:
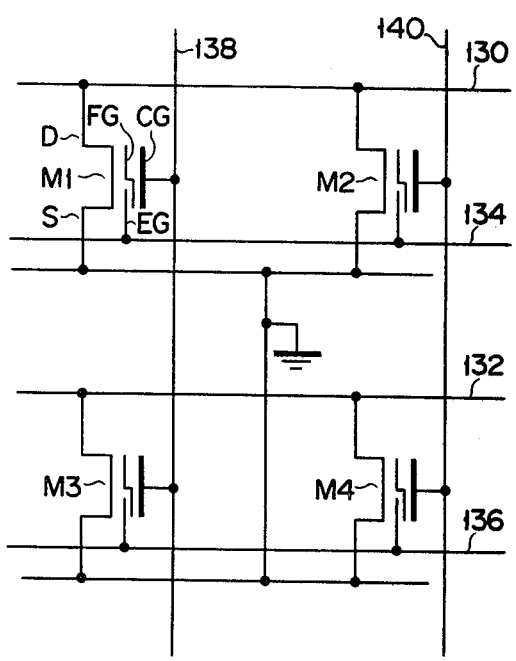
FIG. 6 is an equivalent circuit diagram of the group of memory cells shown in FIG. 2.

FIG. 6 is an equivalent circuit diagram of the group of memory cells shown in FIG. 2. Digit lines 130 and 132 correspond to the fourth conductive layers 120a and 120b, respectively, shown in FIG. 2, erase lines 134 and 136 correspond to the first conductive layer 106, and select lines 138 and 140 correspond to the third conductive layers 114a and 114b. Each of memory cells M1 to M4 comprises a control gate CG, floating gate FG, an erase gate EG, a drain D and a source S. The drains D of the memory cells M1 and M2 are connected to the digit line 130, the drains D of the memory cells M3 and M4 are connected to the other digit line 132, and the sources S of all the memory cells are connected to a point of gound potential.

The mode of operation of the group of the memory cells shown in FIG. 2 will be described with reference to the equivalent circuit diagram shown in FIG. 6. Description will be made with particular reference to the memory cell M1 shown in FIG. 6. Since the electrons are not injected to the floating gate FG of the memory cell M1 at the initial condition, the threshold voltage $V_{TH}$ of the memory cell M1 is at low level.

For writing data in this memory cell M1, a high voltage of positive polarity such as +20 V is applied to the select line 138, and a high voltage of positive polarity such as +20 V is applied to the digit line 130. Then, thermions flow from the source S to the drain D of the memory cell M1 and these thermions are injected to the floating gate FG from the channel region formed between the source and the drain. As a result of this, the threshold voltage $V_{TH}$ of the memory cell M1 is raised. For writing data, it is also possible to apply a high voltage pulse such as +20 V, or a dc voltage of +5 or 0 V to the erase line 134, or to open the erase line 134. It thus suffices to apply a predetermined voltage across the source and the drain and to apply a voltage of the same polarity to the first and third conductive layers.

For reading data from the memory cell M1, the select line 138 is selected and a high voltage such as +5 V is applied to the control gate CG of the memory cell M1. If the threshold voltage $V_{TH}$ is low when the high voltage is applied, the memory cell M1 is turned on. Then, a current flows from the digit line 130 through the memory cell M1 to the point of ground potential.

If the threshold voltage $V_{TH}$ is high when the high voltage is applied, this memory cell M1 is off-state and the current does not flow. If logic level "1" is assigned to the condition wherein the current flows through the memory cell M1, and logic level "0" is assigned to the condition wherein the current does not flow through the memory cell M1, this memory cell may be used as a memory device. Since the floating gate FG is surrounded by the insulating films so as to be insulated from other elements, the electrons injected to the floating gate cannot be emitted outside the floating gate under the normal conditions. Therefore, this memory cell may be used as a nonvolatile memory device.

For erasing the data which has been written, the select line 138 and the digit line 130 are set at 0 V and a high voltage pulse such as +40 V is applied to the erase line 134. When this voltage is applied, field emission is caused between the floating gate FG and the erase gate EG of the memory cell M1 so that the electrons stored in the floating gate FG are emitted to the outside through the erase gate EG and the erase line 134. Consequently, the threshold voltage $V_{TH}$ of the memory cell M1 is restored to the low level as in the initial condition. For erasing data, it suffices to set the source region, the drain region, and the third conductive layer at substantially the same potential and to apply a voltage of the same polarity as that for writing data to the first conductive layer. If the voltage to be applied to the first conductive layer is greater than that to be applied to the first conductive layer for writing data, erasing of data may be performed with better efficiency.

In erasing data, a high voltage is applied to the erase line 134. However, since the insulating film 117 (FIGS. 2 and 5), thicker than the gate insulating films 102a, 102b, 102c and 102d, is formed between the N+-type semiconductor layer 116c and the part 146 of the first conductive layer which is on the regions other than the field insulating film 104b, the leakage current does not flow through this part.

The group of memory cells of the above construction has various advantages to be described below:

(b1) One transistor may constitute one memory cell which is capable of electrically erasing data. Therefore, the packaging density of the $E^2P$-ROMs may be made substantially the same for the EP-ROMs of the ultraviolet ray erasable type. Since less expensive plastic material may be used for the package, the manufacturing cost is less than that of the EP-ROMs of the ultraviolet erasable type.

(b2) Writing, erasing and reading out data may be performed with unipolar power sources. Power sources are only required to apply +20 V for writing, +40 V for erasing, and +5 V for reading, all of the positive polarity. Furthermore, it is possible to use only a single power source, that is, to dispense with all the other power sources by obtaining +20 V and +40 V from a voltage of +5 V through a booster. Since all the power sources may be mounted on the printed circuit board, a semiconductor memory device using the memory cell group is capable of writing, erasing and reading out data.

(b3) Unlike conventional $E^2P$-ROMs, the transistor for bit selection is unnecessary. Therefore data may be erased in units of words and all the bits with ease if a semiconductor memory device is constituted by the above-mentioned memory cells.

(b4) Since the field emission is utilized for erasing data, data may be erased in a short period of time.

(b5) Since data is written by the injection of thermions and data is erased by the field emission, the insulating films around the floating gate may be formed relatively thick. Therefore, the nonvolatile characteristics, that is, the data holding characteristics, may be improved.

(b6) The method for manufacturing the memory cell described above only requires the process for forming a three-layered polycrystalline silicon film by the conventional silicon gate process and requires no other processes.

(b7) Since the thickness of the field insulating film below the erase gate is greater than that of the insulating film interposed between the erase gate and the floating gate, application of a high voltage to the erase gate for erasing of data only results in discharge between the floating gate and erase gate and does not result in discharge between the semiconductor substrate and the erase gate.

In the memory cell described above, the floating gate is located above the erase gate at the part where the floating gate overlaps the erase gate. However, the floating gate may be formed below the erase gate at this part. In this case, since the capacitance between the control gate and the floating gate becomes small, an extra voltage must be applied for reading out and writing data.

Figure 7A:
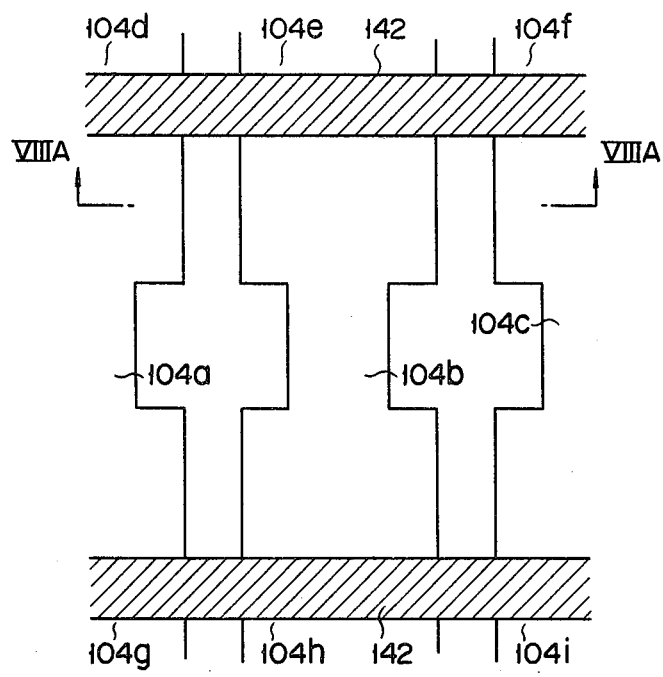
FIGS. 7A to 7E are plan views of a semiconductor substrate for explaining a method for manufacturing the group of memory cells shown in FIG. 2.
Figure 7B:
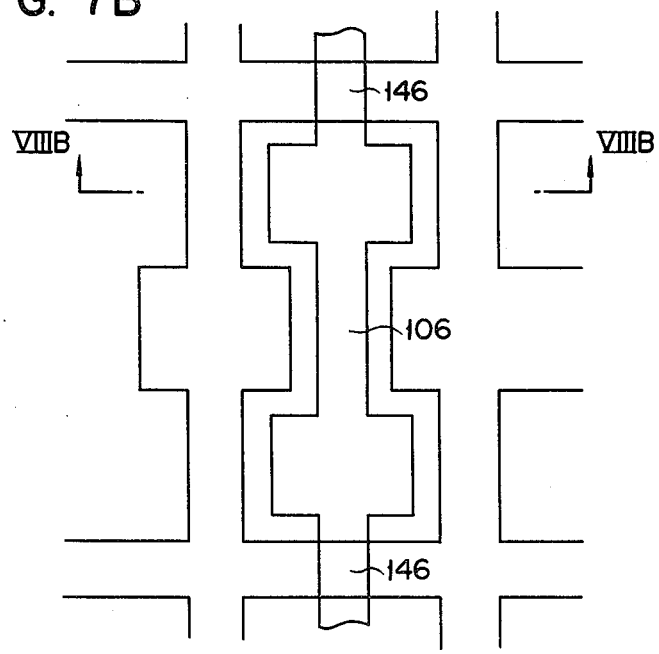

The method for manufacturing the group of memory cells shown in FIG. 2 will now be described with reference to FIGS. 7A to 7E and FIGS. 8A to 8E. FIGS. 7A to 7E are plan views of the semiconductor substrate and FIGS. 8A to 8E are sectional views along the lines VIIIA—VIIIA, VIIIB—VIIIB, . . . VIIIE—VIIIE, respectively, of FIGS. 7A to 7E. As shown in FIGS. 7A and 8A, an insulating film of 1μ thickness is grown on the surface of the P-type silicon semiconductor substrate 100, and the field insulating films 104a, 104b, . . . 104i are formed by photolithography. In each of regions 142 indicated by hatched lines in FIG. 7A, is selectively diffused phosphorus or arsenic by the ion-implantation method or diffusion method.

After this step of diffusing an impurity, the parts of the surface of the semiconductor substrate 100, other than those where the field insulating films 104a to 104i are formed, are exposed. On the exposed surfaces, a thermally oxidized film 144 of a relatively small thickness, i.e., 1,000 to 2,000 Å, is formed by the thermal oxidation method.

Figure 8A:
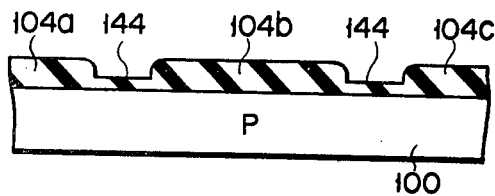
FIGS. 8A to 8E are sectional views along the lines VIIIA—VIIIA, VIIIB—VIIIB, . . . , VIIIE—VIIIE, respectively, of FIGS. 7A to 7E.
Figure 8B:
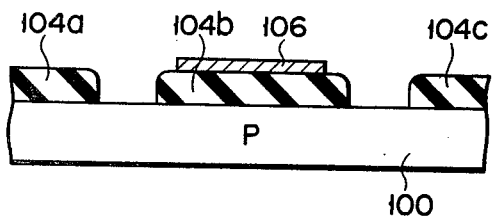

A polycrystalline silicon layer of 6,000 Å thickness is grown on the entire surface of the structure, and phosphorus or arsenic is doped in this polycrystalline silicon. This polycrystalline silicon layer is etched by photolithography to form the first conductive layer 106 as shown in FIGS. 7B and 8B. Using the first conductive layer as a mask, the thermally oxidized film 144 is removed and thereby forms the insulating film 117, having a thickness of 1,000 to 2,000 Å below the part 146 of the first conductive layer 106. It is to be noted that the first conductive layer may be formed over the field insulating films 104a and 104c, adjacent to the field insulating film 104b.

Figure 7C:
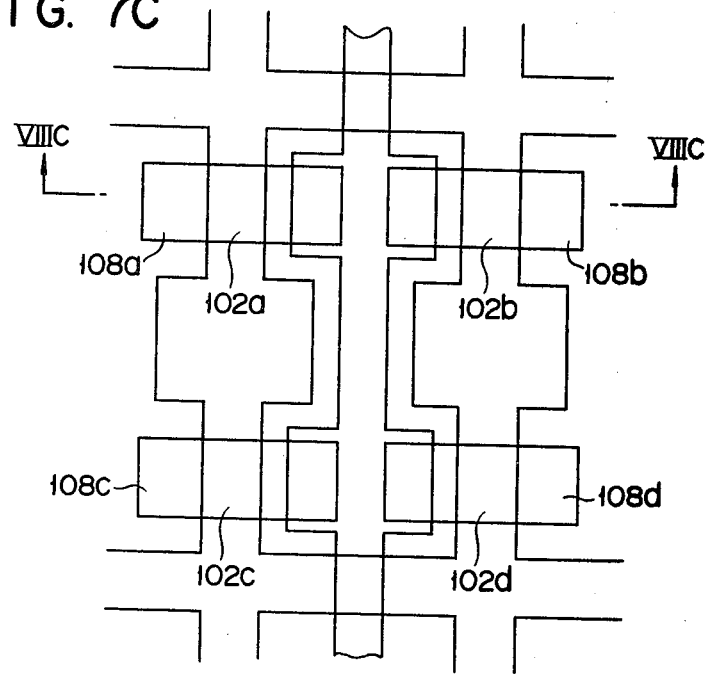
Figure 8C:
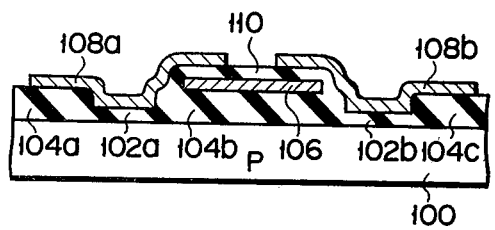

In the next step as shown in FIGS. 7C and 8C, the gate insulating films 102a, 102b, 102c and 102d and the insulating film 100 having a thickness of 500 Å, are formed by the thermal oxidation method on the exposed semiconductor substrate 100 and the first conductive layer 106. A polycrystalline silicon layer of 5,000 Å thickness is grown thereover by the CVD method. The second conductive layers 108a, 108b, 108c and 108d are formed on the gate insulating films 102a, 102b, 102c and 102d by photolithography.

Figure 7D:
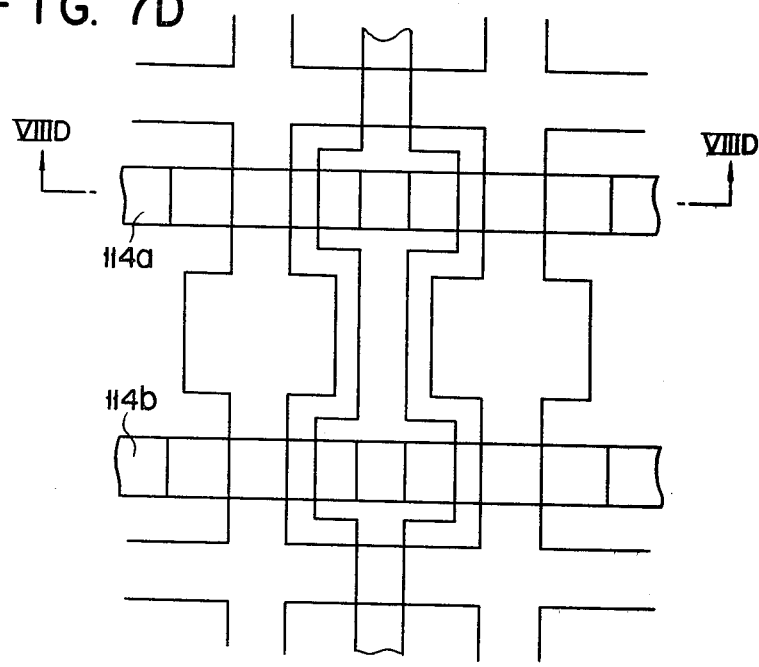
Figure 8D:
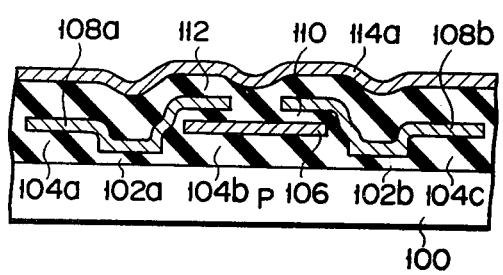

In the next step shown in FIGS. 7D and 8D, the insulating film 112, which has a thickness of 1,000 to 2,000 Å, is formed by the thermal oxidation method and a polycrystalline silicon layer is formed thereover. The polycrystalline silicon layer is etched by photolithography to form the third conductive layers 114a and 114b which are to function as the control gates. Then, using the third conductive layers as a mask, the second conductive layers 108a, 108b, 108c and 108d are etched to form the floating gates in a self-aligned manner.

Figure 7E:
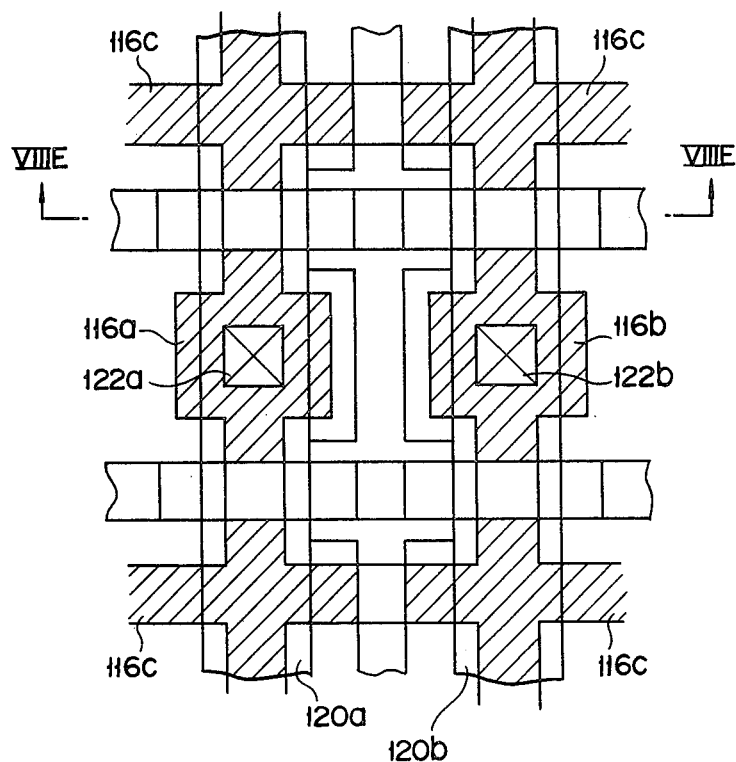
Figure 8E:
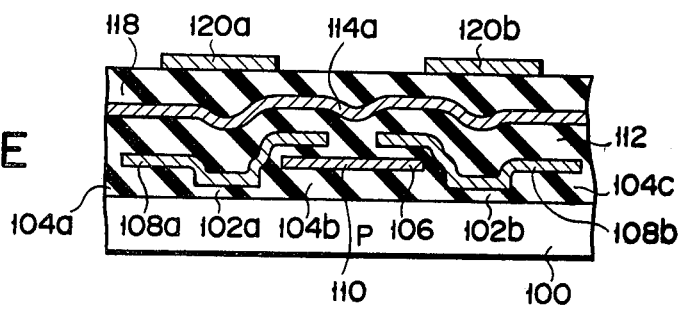

In the next step, using as a mask the second conductive layers 108a to 108d, the third conductive layers 114a and 114b, and the field insulating films 104a to 104i, phosphorus or arsenic is diffused in the regions indicated by the hatched lines in FIG. 7E to form the N+-type semiconductor layers 116a, 116b, and 116c. Thereafter, the insulating film 118 is deposited over the entire surface of the structure as shown in FIGS. 7E and 8E, to selectively form contact holes in the insulating film 118 which reach the N+-type semiconductor layers 116a and 116b. An aluminum film is then deposited over the insulating film 118 and the aluminum film is selectively etched by photolithography to form the fourth conductive layers 120a and 120b. The fourth conductive layers 120a and 120b are connected to the N+-type semiconductor layers 116a and 116b through the contact holes 122a and 122b, respectively.

The above-mentioned group of memory cells is not limited to those described above. For example, it is also possible to form the first conductive layer on the field insulating film 104a and to make the other edges of the second conductive layers 108a and 108c overlap, with an insulating film interposed therebetween, with the first conductive layer being on the field insulating film 104a. Alternatively, it is also possible to form the first conductive layer on the field insulating film 104c and to make the other edges of the second conductive layers 108b and 108d overlap, with an insulating film interposed therebetween, with the first conductive layer on the field insulating film 104c.

In the above group of memory cells, the first conductive layer 106 which function as the erase gate is common to the floating gates which are symmetrically arranged about this conductive layer. However, it is to be understood that the erase gate may be so formed as to erase the data of floating gate of only one memory cell.

The first conductive layer 106 and the second conductive layers 108a to 108d may be made of molybdenum.

Figure 9:
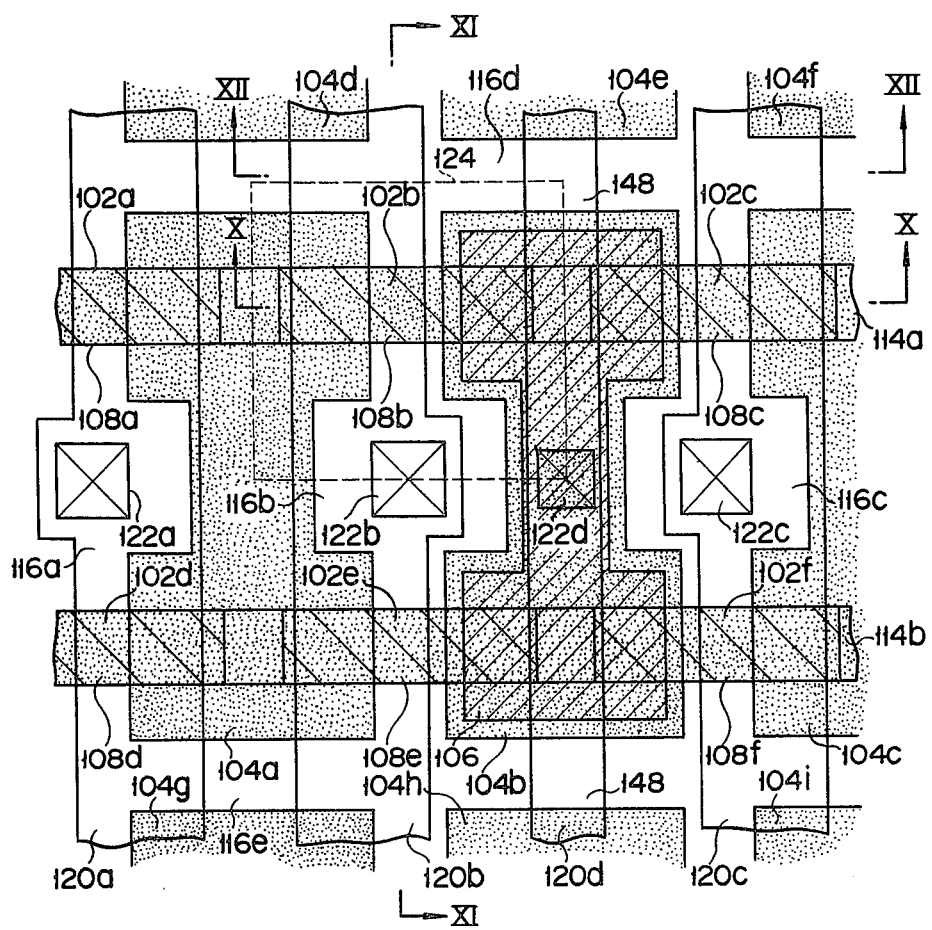
FIG. 9 is a plan view of the second group of memory cells constituting the semiconductor memory device according to the present invention.
Figure 10:
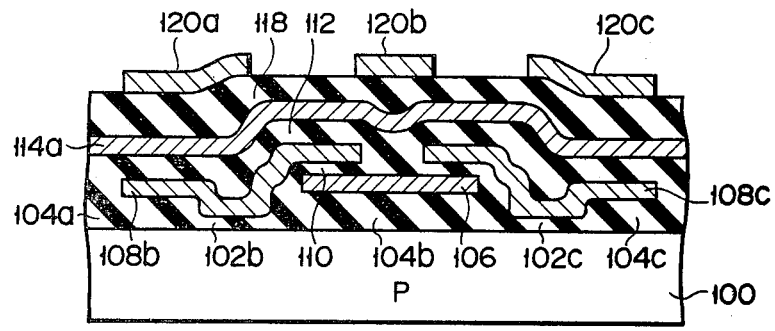
FIG. 10 is a sectional view along the line X—X of FIG. 9.
Figure 11:
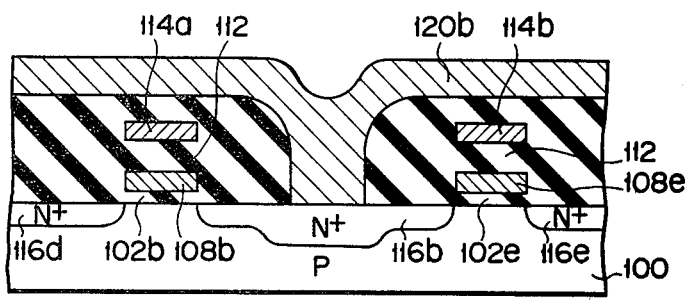
FIG. 11 is a sectional view along the line XI—XI of FIG. 9.
Figure 12:
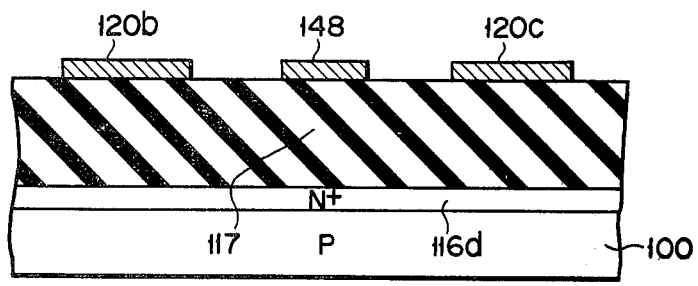
FIG. 12 is a sectional view along the line XII—XII of FIG. 9.

A second group of memory cells constituting another semiconductor memory device of the present invention will now be described referring to FIGS. 9 to 12. FIG. 9 is a plan view of a plurality of memory cells, FIG. 10 is a sectional view along the line X—X of FIG. 9, FIG. 11 is a sectional view along the line XI—XI of FIG. 9, and FIG. 12 is a sectional view along the line XII—XII of FIG. 9. Referring to FIG. 9, the doped regions of the semiconductor substrate 100 are indicated by the clear areas, the oxide areas are indicated by the dotted areas, and the polycrystalline silicon members are indicated by the cross-hatched areas.

The gate insulating films 102a to 102f of 500 Å thickness are formed on the surface of the P-type silicon semiconductor substrate 100 with equal intervals therebetween in an X-Y matrix form. The field insulating films 104a, 104b, . . . ,104i are also formed on the surface of the semiconductor substrate 100. The field insulating film 104a is formed between the paired gate insulating films 102a and 102d and the paired gate insulating films 102b and 102e. The field insulating film 104b is formed between the paired gate insulating films 102b and 102e and the paired gate insulating films 102c and 102f. The field insulating film 104c is formed at the other edges of the paired gate insulating films 102c and 102f.

The first conductive layer 106, having a thickness of 6,000 Å and consisting of polycrystalline silicon doped with phosphorus or arsenic, is formed in an island form. The second conductive layers 108a, 108b, 108c, 108d, 108e and 108f, having a thickness of 5,000 Å and consisting of polycrystalline silicon, are formed on the gate insulating films 102a, 102b, 102c, 102d, 102e and 102f, respectively, to be separate from each other. The respective right edges of the second conductive layers 108b and 108e overlap the left edge of the first conductive layer 106 with the insulating film 110 of 500 Å thickness interposed therebetween. The left edges of the second conductive layers 108c and 108f also overlap the right edge of the first conductive layer 106 with the insulating film 110 interposed therebetween.

The third insulating film 112, which has a thickness of 1,000 to 2,000 Å and which consists of polycrystalline silicon, is formed on the second conductive layers 108a, 108b and 108c with the insulating film 112 interposed therebetween. The third conductive layer 114a has substantially the same width as those of the second conductive layers 108a, 108b and 108c. The third conductive layer 114b of polycrystalline silicon is formed on the second conductive layers 108d, 108e and 108f with the insulating film 112 interposed therebetween. The third insulating film 114b also has the same width as those of the second conductive layers 108d, 108e and 108f.

The N+-type semiconductor layer 116a is formed on the surface region of the semiconductor substrate 100 which is disposed between the gate insulating film 102a and the gate insulating film 102d. The N+-type semiconductor layer 116b is formed on the surface region of the semiconductor substrate 100 which is disposed between the gate insulating film 102b and the gate insulating film 102e. The N+-type semiconductor layer 116c is formed on the surface region of the semiconductor substrate 100 which is disposed between the gate insulating film 102c and the gate insulating film 102f. The continuous N+-type semiconductor layer 116d is formed on the surface region of the semiconductor substrate 100 which is opposite to the N+-type semiconductor layers 116a, 116b and 116c with respect to the gate insulating films 102a, 102b and 102c. A continuous semiconductor layer 116e is formed on the surface region of the semiconductor substrate 100 which is opposite to the N+-type semiconductor layers 116a, 116b and 116c with respect to the gate insulating films 102d, 102e and 102f.

The fourth conductive layers 120a, 120b, 120c and 120d, all of aluminum, are formed with the insulating film 118 interposed therebetween, on the third conductive layers 114a and 114b and the first conductive layer 106. The fourth conductive layer 120a and the N+-type semiconductor layer 116a are connected through the contact hole 122a. The fourth conductive layer 120b and the N+-type semiconductor layer 116b are connected through the contact hole 122b. The fourth conductive layer 120c and the N+-type semiconductive layer 116c are connected through a contact hole 122c. The fourth conductive layer 120d is connected to the first conductive layer 106 through a contact hole 122d.

The insulating film 117 of a thickness greater than that for the first embodiment is disposed between a part 148 of the fourth layer 120d which is not on the field insulating film 104b and the N+-type semiconductor layers 116d and 116e (FIG. 12). The thickness of the insulating film 117 is greater than those of the gate insulating films 102a to 102f. The N+-type semiconductor layers 116d and 116e are connected to a point of reference potential, for example, a point of ground potential.

The region 124 indicated by the broken line in FIG. 9 indicates a memory cell for 1 bit of the semiconductor memory device. This memory cell is a MOS transistor which has, as is apparent from FIG. 9, the second conductive layer 108b as a floating gate, the third conductive layer 114a as a control gate, the first conductive layer 106 as an erase gate, the N+-type semiconductor layer 116b as a drain, and the N+-type semiconductor layer 116d as a source.

As may be seen from FIG. 10, the control gate 114a is common to memory cells for 2 bits, and the island-shaped erase gate 106 is formed commonly for the memory cells for 4 bits. A pair of memory cells having the common control gate 114a are formed symmetrically about the erase gate 106. The control gate 114a is formed on the semiconductor substrate 100 with the insulating film interposed therebetween. The floating gates 108b and 108c, and the erase gate 106 are juxtaposed in the insulating film interposed between the erase gate 114a and the semiconductor substrate 100. Since the erase gate 106 is formed on the field insulating film 104b, parts of the floating gates 108b and 108c overlapping with the erase gate 106 are present in the field region.

As can also be seen from FIG. 10, at this overlapping part, the floating gate (the second conductive layer) 108a is located above the erase gate (the first conductive layer) 106. Therefore, the distance between the semiconductor substrate 100 and the first conductive layer 106 is smaller than the distance between the semiconductor substrate 100 and the second conductive layer 108a.

The equivalent circuit of the group of memory cells shown in FIGS. 9 to 11 is of the same configuration as that shown in FIG. 6. The operation of this equivalent circuit is also the same as that in the first group of memory cells, so that the description thereof will be omitted.

The second group of memory cells has, in addition to the seven advantages of the first group of memory cells, two more advantages described below:

(b8) Since the erase line comprises the fourth conductive layer 120d of aluminum, the thick insulating film 117 may be formed between the N+-type semiconductor layers 116d and 116e and the part 148 of the fourth conductive layer formed on the region other than on the field insulating film 104b. Consequently, the current leakage is not caused even if a high voltage is applied to the erase line.

(b9) The fourth conductive layer 120d and the erase gate for 4 bits may be connected through a single contact hole if the erase gate is formed to be common for memory cells for 4 bits as in the second embodiment. Therefore, the number of the contact holes may be reduced and the packaging density may be improved.

Figure 13A:
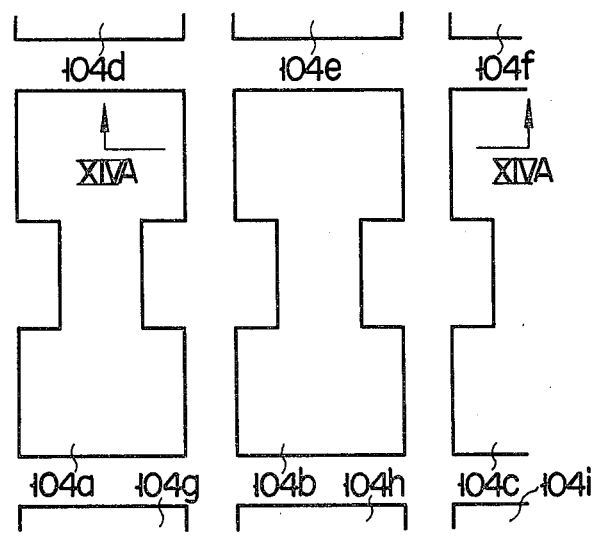
Figure 13B:
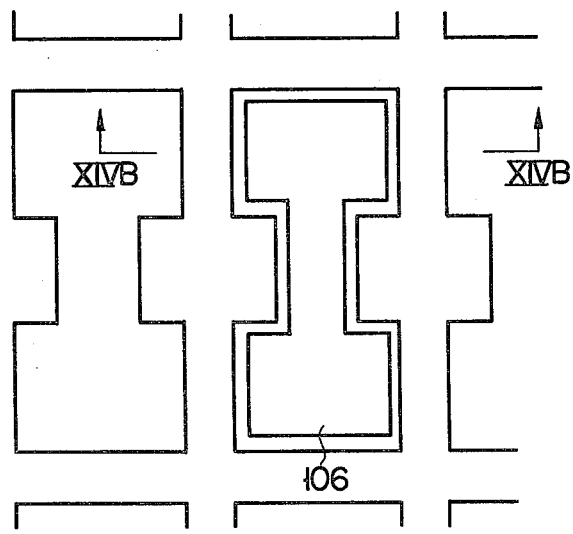

The method for manufacturing the second group of memory cells will be described with reference to FIGS. 13A to 13E and FIGS. 14A to 14E. FIGS. 13A to 13E are plan views of the semiconductor substrate, and FIGS. 14A to 14E are sectional views along the lines XIVA—XIVA, XIVB—XIVB, . . . , XIVE—XIVE, respectively, of FIGS. 13A to 13E. As shown in FIGS. 13A and 14A, an insulating film of 1μ thickness is grown on the surface of the P-type silicon semiconductor substrate 100. The field insulating films 104a, 104b, 104c, 104d, 104e, 104f, 104g, 104h and 104i are formed by photolithography. A polycrystalline silicon layer of 6,000 Å thickness is grown over the entire surface of the structure. Phosphorus or arsenic is doped in this polycrystalline silicon layer. The polycrystalline silicon layer is etched by photolithography to form the first conductive layer 106 on the field insulating film 104b as shown in FIGS. 13B and 14B. The first conductive layer may also be formed as needed on the field insulating films 104a, 104b, 104c, 104d, 104e, 104f, 104g, 104h and 104i which are adjacent to the field insulating film 104b.

Figure 13C:
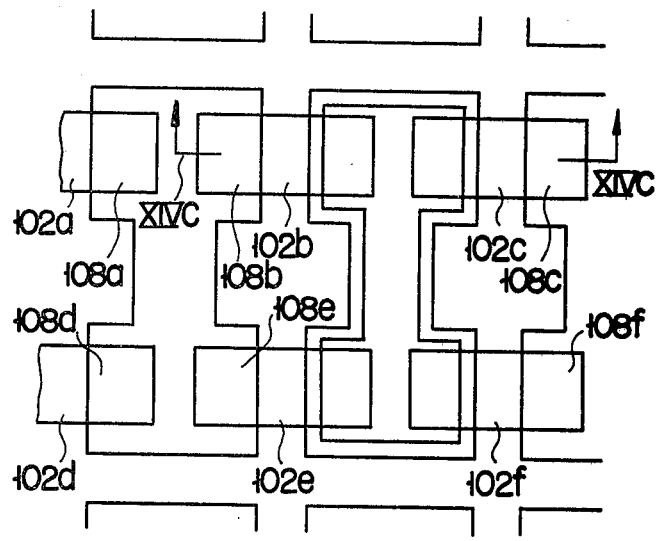

In the next step, as shown in FIGS. 13c and 14c, the insulating film 110 and the gate insulating films 102a, 102b, 102c, 102d, 102e and 102f which have a thickness of 500 Å are formed by the thermal oxidation method on the first conductive layer 106 and the exposed semiconductor substrate 100, respectively. A polycrystalline silicon layer of 5,000 Å is grown by the CVD method thereover, and the second conductive layers 108a to 108f as the floating gates are formed on the gate insulating films 102a to 102f and the insulating film 110.

Figure 13D:
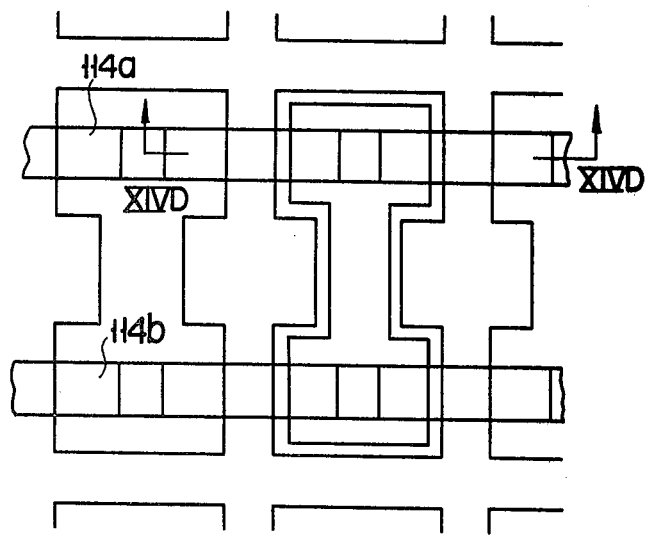

In the next step as shown in FIGS. 13D and 14D, the insulating film 112 which has a thickness of 1,000 to 2,000 Å is formed by the thermal oxidation method, and a polycrystalline silicon layer is formed thereover. The polycrystalline silicon layer is etched by photolithography to form the third conductive layers 114a and 114b to function as the control gates. Using the third conductive layers as a mask, the second conductive layers 108a to 108f are etched to form the floating gates in a self-aligned manner.

Using as a mask the second conductive layers 108a to 108f, the third conductive layers 114a and 114b, and the field insulating films 104a to 104i, phosphorus or arsenic is doped in the region indicated by the hatched lines in FIG. 13E to form the N+-type semiconductor layers 116a, 116b and 116c as the drains and N+-type semiconductor layers 116d and 116e as the sources. Thereafter, as shown in FIGS. 13E and 14E, the insulating film 118 is deposited on the entire surface of the structure and holes are selectively formed which extend to the N+-type semiconductor layers 116a, 116b and 116c and the first conductive layer 106.

After an aluminum film is deposited over the insulating film 118, this aluminum film is selectively etched by photolithography to form the fourth conductive layers 120a, 120b, 120c and 120d. The fourth conductive layers 120a, 120b and 120c are connected to the N+-type semiconductor layers 116a, 116b and 116c through the contact holes 122a, 122b and 122c, respectively. The fourth conductive layer 120d is connected to the first conductive layer 106 through the contact hole 122d.

In the second group of the memory cells, one erase gate is commonly formed for memory cells for 4 bits. However, it is also possible to form one erase gate for a memory cell for 1 bit or to form one erase gate for memory cells for 2 bits.

Figure 15:
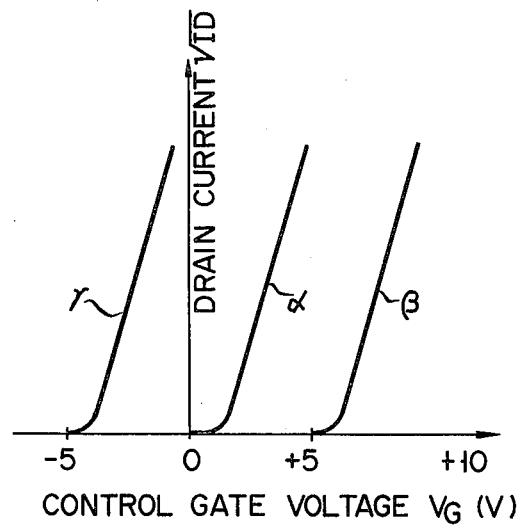
FIG. 15 is a graph for explaining a relation between a control gate voltage VG and a drain current $\sqrt{ID}$ of a MOS transistor having various kinds of data.

In the equivalent circuit shown in FIG. 6 which has been described hereinbefore, when electrons are excessively discharged from the floating gate FG of the memory cell for erasing data, the memory cell does not become the enhancement type but the depletion type. This will be described in more detail with reference to FIG. 15. In FIG. 15, the voltage VG applied to the control gate CG is plotted along the abscissa, and the square root of the drain current ID is plotted along the ordinate. Characteristic curve α shows the enhancement type characteristics of a MOS transistor under the condition that no data is written therein. Characteristic curve β shows the characteristics of the MOS transistor under the condition that data is written therein and the threshold voltage is raised. When the data is erased in a normal manner from the floating gate FG of the memory cell which has the characteristics shown by the characteristic curve β, this memory cell is restored to the condition to have the characteristics shown by the characteristic curve α. However, when electrons are excessively discharged from the floating gate FG for erasing data, the memory cell will have the characteristics of a depletion type device which are shown by a characteristic curve α.

For reading out data from one memory cell, for example, the memory cell M1 shown in FIG. 6, the digit line 130 and the select line 138 are selected and a high voltage is applied to both these lines. Data is read out depending upon whether or not a current flows to the memory cell M1. In this condition, the select line 140 is not selected and is set at low level. However, if electrons are excessively discharged from the floating gate FG of the memory cell M2 and the memory cell M2 becomes depletion type, this memory cell M2 is turned on and a current flows therethrough although it is not selected. Therefore, it is impossible to read out data from the selected memory cell M1.

Figure 16:
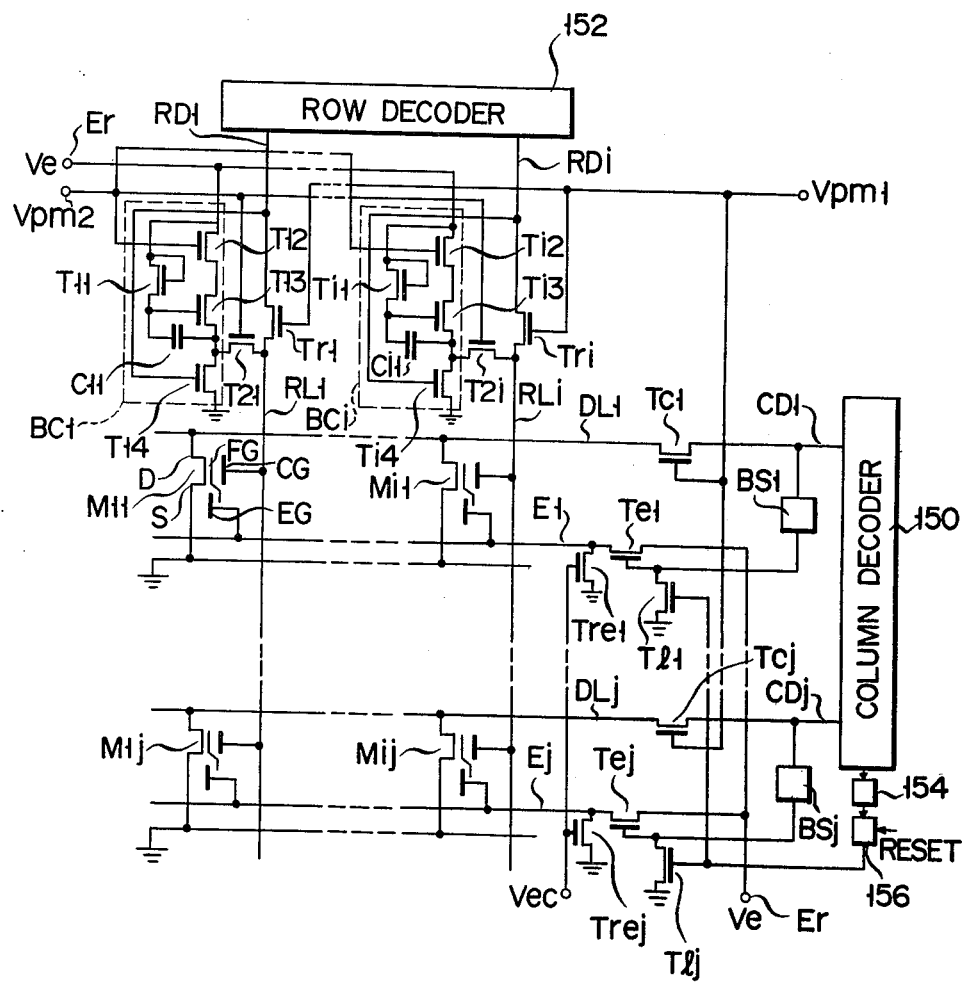
FIG. 16 is a circuit diagram of a first embodiment of the semiconductor memory device according to the present invention.

Referring to FIG. 16, the first embodiment of the semiconductor memory device which eliminates the above drawbacks will now be described according to the present invention. This semiconductor memory device uses the first group of memory cells shown in FIG. 2 or the second group of memory cells shown in FIG. 9. The memory cells M11 to Mi1 and M1j to Mij are aligned, numbering i in the column direction and numbering j in the row direction, respectively, in a matrix form as a memory matrix. The respective memory cells M11 to Mij have control gates CG, floating gates FG, erase gates EG, drains D and sources S. The sources of all the memory cells are grounded.

The drains D of the memory cells which number i and which are aligned on the same column are commonly connected to the digit lines DL1, . . . , DLj which number j, respectively. The digit lines DL1, . . . , LDj which number j are respectively connected to respective output lines CD1, . . . , CDj of a column decoder 150 through MOS transistors TC1, . . . , TCj. The gates of the MOS transistors TC1, . . . , TCj receive a signal Vpm1. This signal Vpm1 is set at high level when data is read out or written or when data erasure is detected; the signal Vpm1 is set at low level when data is erased.

The column decoder 150, as shown in FIG. 17, is constituted by decoders D1, . . . , Dj which receive column address signals A1, . . . , Aj to $\overline{A1}$, . . . , $\overline{Aj}$; gate transistors Tg1, . . . , Tgj; a MOS transistor Tw1 of enhancement type which supplies a write voltage Vpp to a line L to write data; a MOS transistor Tw2 of enhancement type for specifying writing of data; and a MOS transistor Trd of depletion type which supplies a power source voltage Vcc of +5 V to the line L when data is read out or data erasure is detected.

The decoder D1 is constituted by MOS transistors Td11, Td12, . . . , Td1j gates of which receive the column address signals A1, . . . , Aj, one end each of which is grounded and the other end each of which is connected to the gate of the transistor Tg1; a transistor Td1, one end of which receives the power source voltage Vcc and the other end and the gate of which are connected to the gate of the transistor Tg1; and a MOS transistor Tw31 a gate of which receives a signal Vpm3 which is at high level when data is written and which is at low level when data is read out or erased or when data erasure is detected, one end of which receives the write voltage Vpp of, for example, +20 V, and the other end of which is connected to the gate of the transistor Tg1 through the MOS transistor Tdw1 of depletion type.

The decoder Dj is arranged in the same manner as the decoder D1. A write program voltage Vdata is applied to the transistor Tw2. The transistor Tw1 operates in response to the signal Vpm3 supplied to the gate of the transistor Tw2. The column decoder 150 with the above arrangement selects one of the output lines CD1, . . . , CDj in response to a column address of the decoders D1, . . . , Dj when data is read out, written, and erased, and when data erasure is detected. At the same time, the transistors Tw1, Tw2 and Trd supply a signal of high level of +20 V in the data write mode, or a signal of high level of +5 V in the data readout, data erasing and data erasure detecting modes, to a selected output line. A signal of low level of 0 V is output at the non-selected output lines.

The erase gates EG of the memory cells numbering i on the same column are commonly connected to the erase lines E1, ..., Ej numbering j, respectively. The erase lines E1, ..., Ej are connected to erase terminals Er which receive an erase voltage Ve through the MOS transistors Te1, ..., Tej. The erase lines E1, ..., Ej are also grounded through the MOS transistors Tre1, ..., Trej, respectively, the gates of which receive a data erase check signal Vec when data erasure is detected. The gates of the transistors Te1, ..., Tej are connected to output ends of boosters BS1, ..., BSj which boost the voltage of the output lines CD1, ..., CDj of the column decoder 150 and are grounded through MOS transistors Tl1, ..., Tlj, respectively.

Furthermore, the line L of the column decoder 150 is connected to a sense amplifier 154 as shown in FIGS. 16 and 17. The sense amplifier 154 is constituted by inverters I1, I2 and I3 one end each of which receives the power source voltage Vcc and the other end each of which is grounded. The inverters I1, I2 and I3 are connected in series with each other. The sense amplifier 154 detects whether or not a current flows through a selected one of the output lines CD1, ..., CDj. An output signal from the sense amplifier 154 is supplied to and latched in a resettable latch circuit 156.

An output end 158 of the latch circuit 156 is connected to gates of the MOS transistors Tl1, ..., Tlj. The latch circuit 156 is constituted by MOS transistors Q11, Q12, Q13 and Q14 of enhancement type and MOS transistors Q15 and Q16 of depletion type. The gate of the transistor Q14 receives a reset signal. One end each of the transistors Q11 and Q12 which are connected in parallel with each other is grounded and the other end is connected to one end of the transistor Q15. The gate of the transistor Q11 is connected to the output end of the sense amplifier 154.

One end of the transistor Q15 is connected to its gate and the other end thereof receives the power source voltage Vcc. One end each of the transistors Q13 and Q14 connected in parallel with each other is grounded and the other end thereof is connected to one end of the transistor Q16. The gate of the transistor Q13 is connected to the gate of the transistor Q15. The gate of the transistor Q14 receives the reset signal.

One end of the transistor Q16 is connected to its gate and the gate of the transistor Q12, and the other end of the transistor Q16 receives the power source voltage Vcc. A node A between the transistors Q13 and Q16 is connected to the output end 158 of the latch circuit 156.

The control gates CG of the memory cells numbering j on the same row are connected to row lines RL1, ..., RLi numbering i, respectively. The row lines RL1, ..., RLi are connected to output ends RD1, ..., RDi of a row decoder 152 through the MOS transistors Tr1, ..., Tri which receive the signal Vpm1 at their gates, respectively. A row address is input to the row decoder 152. One of the output ends of the row decoder 152 is selected in response to a row address when data is read out or written. A signal of high level is output from the selected output end of the row decoder 152, while a signal of low level is output from all of the non-selected output ends.

The row lines RL1, ..., RLi are respectively connected to boosters BC1, ..., BCi through MOS transistors T21, ..., T2i gates of which receive a signal Vpm2. The signal Vpm2 is at low level when data is read out or written and is at high level when data is erased and the data erasure is detected.

The booster BC1 is constituted by MOS transistors T11, T12, T13 and T14 and a capacitor C11. The booster BC1 compensates for a drop in the erase voltage Ve of +40 V because of the MOS transistors T1 and T2, by utilizing a bootstrap circuit. The gate of the transistor T12 receives the signal Vpm2 and one end of the transistor T12 is connected to the erase terminal Er, the gate of the transistor T11 and one end thereof. Furthermore, the other end of the transistor T12 is connected to one end of the transistor T13 a gate of which is connected to the other end of the transistor T11 and to one end of the capacitor C11. The other end of the transistor T13 is connected to the other end of the capacitor C11 and one end each of the transistors T14 and T21. The other end of the transistor T14 is grounded and the gate thereof is connected to the output end RD1 of the row decoder 152. The booster BCi is arranged in the same manner as the booster BC1.

The mode of operation of the semiconductor memory device with the above arrangement will be described. When data is written, the signal Vpm1 is set at high level, the signal Vpm2 is set at low level, the signal Vpm3 is set at high level, and the signal Vec is set at low level. Therefore, the MOS transistors Tr1, ..., Tri are turned on, the MOS transistors T21, ..., T2i are turned off, and the MOS transistors Tc1, ..., Tcj are turned on, so that an output from the row decoder 152 is supplied to the row lines RL1, ..., RLi, while an output from the column decoder 150 is supplied to the column lines DL1, ..., DLj. For example, when the memory cell Mi1 is selected, the row line RLi becomes at high level and the digit line DL1 becomes at high level. Therefore, the program voltage is applied to the memory cell Mi1 and electrons are injected to the floating gate FG of the memory cell Mi1. As a result, a threshold voltage of the memory cell Mi1 rises and data writing is completed.

When data is erased, the data erase operation and the data erase detecting operation are alternately repeated a plurality of times. When data erasure is performed, the signal Vpm1 is at low level, the signal Vpm2 is at high level, the signal Vpm3 is at low level and the signal Vec is at low level. The erase voltage Ve is set at +40 V. For example, when the memory cell Mi1 is selected, the MOS transistor Ti4 of the booster BCi is turned on, while the respective transistors T14, ..., T(i-1)4 of the other boosters BC1, ..., BC(i-1) are rendered nonconductive. Therefore, only the row line RLi is set at low level since a signal of low level is supplied through the MOS transistors Ti4 and T2i. Other row lines RL1, ..., RL(i-1) are set at substantially +30 V.

On the other hand, since the signal Vpm1 is set at low level, the MOS transistors Tc1, ..., Tcj are turned off, an output from the column decoder 150 is supplied to the gates of the MOS transistor Te1, ..., Tej through the boosters BS1, ..., BSj, respectively. When the memory cell Mi1 is selected, the power source voltage Vcc is only applied to the output line CD1 of the column decoder 150 by the decoders D1, ..., Dj. Therefore, a voltage of high level is applied to the MOS transistor Te1 through the booster BS1 so that the MOS transistor Te1 is turned on. Furthermore, since the MOS transistors Tre1, ..., Trej are rendered nonconductive, the erase voltage Ve of +40 V is applied only to the erase line E1. Although the erase voltage of +40 V is applied to the erase gates EG of the memory cells M11 to Mi1 numbering i on the first column, data may be erased only from the memory cell Mi1 by increasing a capacitance between the control gates CG and the floating gates FG, and data is not erased from other memory cells M11, ..., M(i-1)1.

As described above, since the control gates CG of the memory cells M11, ..., M(i-1)1 are set at about +30 V, the potential of the floating gates FG becomes high so that electrons are not discharged from the floating gates of the memory cells M11, ..., M(i-1)1. On the other hand, the potential of the control gate CG of the memory cell Mi1 is set at low level, that is, 0 V, so that the potential of the floating gate FG of the memory cell Mi1 is set at about 0 V even though the capacitance between the control gate CG and the floating gate FG is great. Therefore, the voltage of +40 V applied to the erase line E1 is directly applied to a point between the floating gate FG and the erase gate EG of the memory cell Mi1, effectively discharging the electrons from the floating gate FG of the memory cell Mi1 by field emission.

After the data erase operation for the memory cell Mi1 is performed for a predetermined period of time, the data erase detecting operation initiates. During the data erase detecting operation, the signals Vpm1 and Vpm2 are set at high level. The signal Vec is set at high level and the erase voltage Ve is set at 0 V. Furthermore, the reset signal is supplied to the latch circuit 156 and the node A is set at low level. The MOS transistors Tr1, ..., Tri and T21, ..., T2i are turned on and the erase voltage Ve is set at 0 V. The voltage of all the row lines RL1, ..., RLi are 0 V. On the other hand, since the memory cell Mi1 is selected, only the output ends CD1 of the column decoder 150 is set at high level as described above. Furthermore, since the MOS transistors Tc1, ..., Tcj are all turned on, only the column line DL1 is set at high level.

The MOS transistors Tre1, ..., Trej are all turned on, so that the erase lines E1, ..., Ej are all set at 0 V. Therefore, a predetermined voltage difference between the source S and the drain D of the memory cell Mi1 is realized. If data of the memory cell Mi1 is not sufficiently erased, the MOS transistor Mi1 is rendered nonconductive so that a current does not flow through the digit line DL1 and the line L of the column decoder 150. Therefore, the current is not detected by the sense amplifier 154. In other words, the line L of the column decoder 150 is kept at high level and the output from the sense amplifier 154 remains at low level. As a result, the output end 158 of the latch circuit 156 is maintained at low level.

When data erase detection is completed, the data erase operation is performed again for a predetermined period of time. During this data erase operation, data may be sufficiently erased from the memory cell Mi1. When the memory cell Mi1 is being converted to a memory cell of depletion type which turns on even when the potential of the control gate CG is at 0 V, a current flowing from the drain D to the source S of the memory cell Mi1 is detected by the sense amplifier 154 in the subsequent data erase detecting operation. In other words, when a current flows through the memory cell Mi1, the line L of the column decoder 150 is set at low level so that an output at the output end of the sense amplifier 154 becomes at high level.

When a signal of high level is supplied to the latch circuit 156, a node B of the latch circuit 156 is set at low level. The node A connected to the output end 158 of the latch circuit 156 is set at high level (FIG. 17). When an output end 158 of the latch circuit 156 becomes at high level, the MOS transistors Tl1, ..., Tlj are turned on. Therefore, the output ends of the boosters BS1, ..., BSj are grounded. As a result, in the subsequent data erase operation, the MOS transistors Te1, ..., Tej are rendered nonconductive and the erase voltage Ve is thus not applied to the erase line E1. Therefore, electrons are not discharged from the floating gate FG of the memory cell Mi1.

As described above, according to the semiconductor memory device of the embodiment of the present invention, excessive electrons may not be discharged from the floating gate so that the memory cell is constantly maintained as the memory cell of enhancement type. Furthermore, according to this embodiment of the present invention, data erasure for each bit may be performed. Since excessive data is not erased, the power consumption is reduced when data is erased.

Figure 18:
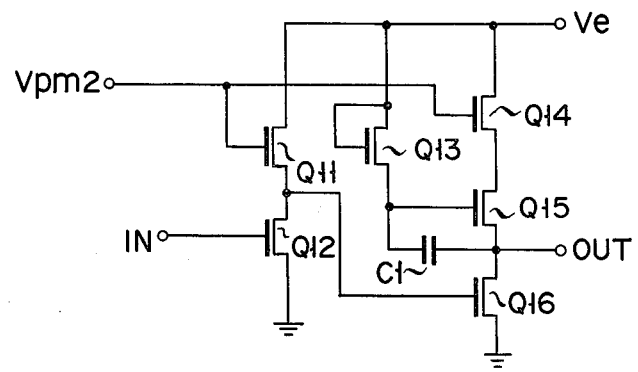
FIG. 18 is a circuit diagram of a booster of FIG. 16.

FIG. 18 shows an example of the boosters BS1, ..., BSj. This booster utilizes a bootstrap. A voltage of, for example, +5 V is supplied to an input terminal IN and a voltage of, for example, +45 V is then output at an output terminal OUT. Therefore, when the output line CD1 of the column decoder 150 shown in FIG. 16 is selected in data erasure operation, a voltage of +45 V is supplied to the gate of the MOS transistor Te1 so that the MOS transistor Te1 is turned on. Then the erase voltage Ve of +40 V is supplied to the erase line E1. The arrangement of the booster will be described below.

One end of a transistor Q12 whose gate is connected to the input terminal IN and whose other end is connected to one end of a transistor Q11 and a gate of a transistor Q16 is grounded. The signal Vpm2 is supplied to the gate of the transistor Q11 which is connected to a gate of a transistor Q14. The other end of the transistor Q11 is connected to one end each of the transistors Q13 and Q14.

The erase voltage Ve is supplied to the other end of the transistor Q11 and one end each of the transistors Q13 and Q14. One end of the transistor Q13 is connected to its gate and the other end thereof is connected to a capacitor C1 and a gate of a transistor Q15. The other end of the capacitor C1 is connected to the output terminal OUT, one end of the transistor Q15 and the other end of a transistor whose one end is grounded. Furthermore, one end of the transistor Q14 receives the erase voltage Ve and the other end thereof is connected to the other end of the transistor Q15.

Figure 19:
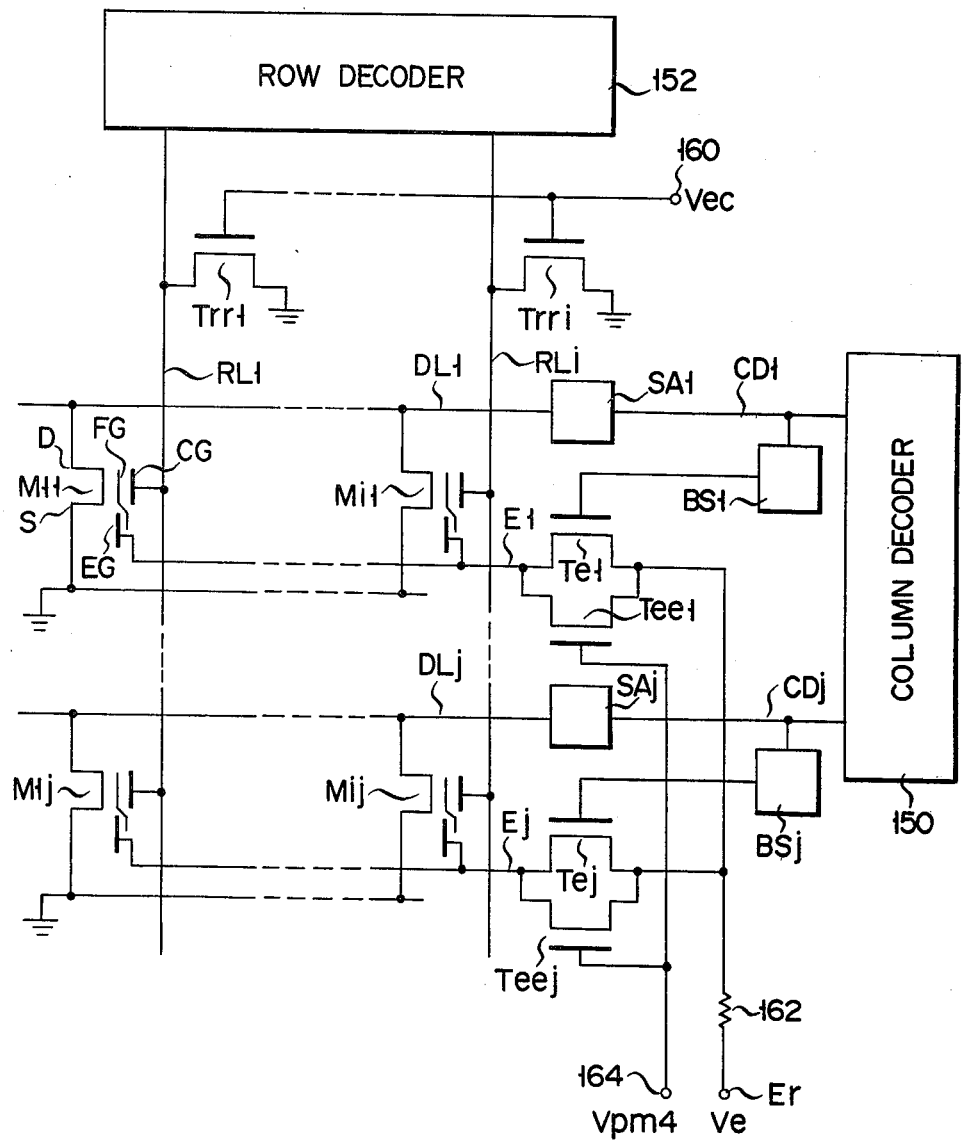
FIG. 19 is a circuit diagram of a second embodiment of the semiconductor memory device according to the present invention.

The second embodiment of the semiconductor memory device according to the present invention will be described with reference to FIG. 19. In this semiconductor memory device, the data erase operation and the data erase detecting operation are simultaneously performed. This semiconductor memory device uses the first group of memory cells shown in FIG. 2 or the second group of memory cells shown in FIG. 9. The memory cells M11 to Mi1 and M1j to Mij are aligned, numbering i in the column direction and numbering j in the row direction, respectively, in a matrix form as a memory matrix. The respective memory cells M11 to Mij have control gates CG, floating gates FG, erase gates EG, drains D and the sources S. The sources of all the memory cells are grounded.

The drains D of the memory cells numbering i which are aligned on the same column are commonly connected to the digit lines DL1, ..., DLj numbering j, respectively. The digit lines DL1, ..., DLj numbering j are connected to the output lines CD1, ..., CDj of the column decoder 150 through the sense amplifiers SA1, ..., SAj, respectively. The column decoder 150 is the same as in FIG. 17. The column decoder 150 selects one of the output lines CD1, ..., CDj in response to a column address when data is read out or written. A signal of high level of, for example, +5 V or +20 V is output at the selected output line, while a signal of low level of 0 V is output at other non-selected output lines.

The control gates CG of the memory cells numbering j and aligned on the same row are connected to the row lines RL1, ..., RLi numbering i, respectively. The row lines RL1, ..., RLi numbering i are respectively connected to the output ends of the row decoder 152. The row decoder 152 which receives a row address selects one of the output ends in response to the input row address when data is read out or written. A signal of high level is output at the selected output end, while a signal of low level is output at other non-selected output ends. The row lines RL1, ..., RLi are grounded through MOS transistors Trr1, ..., Trri, respectively. The gates of the MOS transistors Trr1, ..., Trri are connected to an erase check signal supply terminal 160 which receives the erase check signal Vec.

The erase gates EG of the memory cells numbering i and aligned on the same column are commonly connected to the erase lines E1, ..., Ej numbering j, respectively. The erase lines E1, ..., Ej are connected to the erase terminals Er through a memory protecting resistor 162 and the respective MOS transistors Te1, ..., Tej. The data erase voltage Ve of, for example, +40 V is supplied to the erase terminal Er when data is erased. MOS transistors Tee1, ..., Teej are connected in parallel with the MOS transistors Te1, ..., Tej, respectively. The gates of the MOS transistors Te1, ..., Tej are connected to the output ends of the boosters BS1, ..., BSj which boost a voltage of the output lines CD1, ..., CDj of the column decoder 150, respectively. The gates of the MOS transistors Tee1, ..., Teej are connected to the erase control terminal 164. An erase control signal Vpm4 which is at low level when data is erased and which is at high level when data is read out or written is supplied to the erase control terminal 164.

Sense amplifiers SA1, ..., SAj respectively detect a current at the digits lines DL1, ..., DLj when the output lines CD1, ..., CDj of the column decoder 150 is set at high level. When the sense amplifiers SA1, ..., SAj detect the current of the digit lines DL1, ..., DLj, the output lines CD1, ..., CDj of the column decoder 150 are inverted to low level. The arrangement of the sense amplifier SA1 will be described with reference to FIGS. 20 and 21. The sense amplifier SA1 is constituted by inverters I4 and I5 which are connected in series between the output line CD1 of the column decoder 150 and the digit line DL1; a MOS transistor Ts arranged between the output line CD1 and the ground potential; and a current detecting unit 166 for detecting the presence or absence of a current in the digit line DL1. The logic level at the output line CD1 is transmitted to the digit line DL1 through the inverters I4 and I5. The current detecting unit 166 supplies a signal of high level to the gate of the MOS transistor Ts when the digit line DL1 is set at low level. Therefore, the output line CD1 is set at low level.

The current detecting unit 166 is constituted by the sense amplifier 154 and the latch circuit 156. This sense amplifier 154 is the same as that shown in FIG. 17 and the latch circuit is also the same as that shown in FIG. 17. The same reference numerals in FIG. 21 denote the same parts in FIG. 17 and the detailed description thereof will be omitted. The terminal 168 is connected to the digit line DL1 and a terminal 170 is connected to the gate of the MOS transistor Ts. Before the current detecting operation is performed, the reset signal is input to the gate of the MOS transistor Ql4 of the latch circuit 156 to set the node A at low level. Therefore, MOS transistor Ts is rendered nonconductive.

The mode of operation of the semiconductor memory device shown in FIG. 19 will be described. When data is erased, the data erase voltage of +40 V is supplied to the erase terminal Er and the erase control signal Vpm4 of low level is supplied to the erase control terminal 164. Furthermore, the erase check signal Vec of high level is supplied to the erase check signal supply terminal 160. Since the erase check signal Vec is at high level, the MOS transistors Trr1, ..., Trri are turned on and all the row lines RL1, ..., RLi are set at the ground potential. Since the erase control signal Vpm4 is at low level, the MOS transistors Tee1, ..., Teej are all rendered nonconductive. For example, when the output line CD1 is selected by the column decoder 150, the signal of high level from the output line CD1 is set at a higher level by the booster BS1 to be slightly higher than the erase voltage Ve. This signal of higher level is supplied to the gate of the transistor Te1. Therefore, the MOS transistor Te1 is turned on and the erase voltage Ve is supplied to the erase line E1. As a result, data of the memory cells M11, ..., Mi1 is spontaneously erased.

Figure 20:
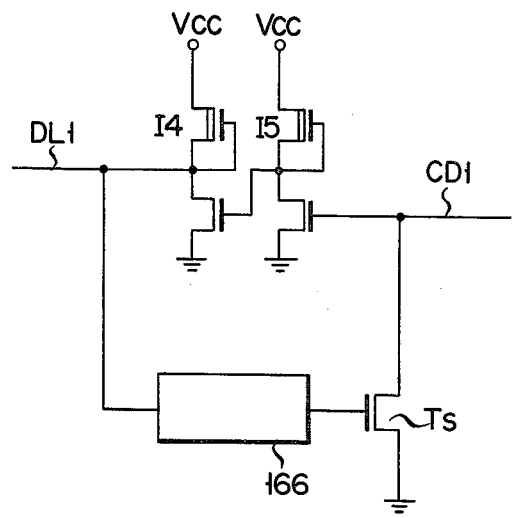
FIG. 20 is a circuit diagram of a sense amplifier of FIG. 19.
Figure 21:
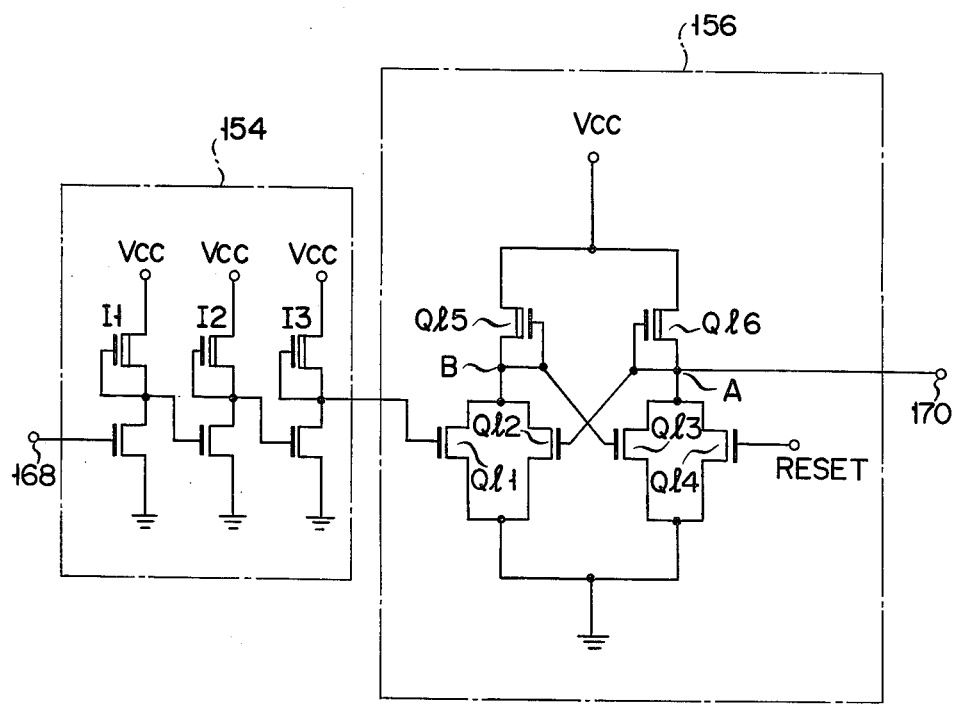
FIG. 21 is a circuit diagram of a current detecting section of FIG. 20.

On the other hand, when the output line CD1 is selected and a signal of high level is supplied to the sense amplifier SA1, the digit line DL1 is set at high level by the inverters I4 and I5 shown in FIG. 20. Therefore, the potential difference between the drains D and sources S of the memory cells M11, ..., Mi1 is given at a predetermined value. After data erasure is initiated and a predetermined period of time elapses, electrons are sufficiently discharged from the floating gates FG of the memory cells M11, ..., Mi1 aligned on the first column. The memory cells M11, ..., Mi1 begin to be converted to the memory cells of depletion type so that a current flows through one of the memory cells. Therefore, the digit line DL1 is set at low level and the current detecting unit 166 then supplies a signal of high level to turn on the MOS transistor Ts. As a result, the output line CD1 of the column decoder 150 is inverted to low level. When an output from the output line CD1 is inverted to be low level, the output from the booster BS1 becomes at low level. The MOS transistor Te1 which has been rendered conductive is turned off, and the erase voltage Ve supplied to the erase line E1 is cut off.

In the second embodiment of the semiconductor memory device according to the present invention, since the supply of the erase voltage Ve is cut off before the memory cell is completely converted to the memory cell of depletion type in the erase operation, excessive discharging of the electrons from the floating gate FG is prevented. Therefore, the memory cell constantly operates as the memory cell of enhancement type. Furthermore, since excessive data is not erased, the power consumption is reduced in the data erase operation.

The present invention is not limited to the particular embodiment described above. The row lines RL1, ..., RLi in the first embodiment may be grounded through the MOS transistors Trr1, ..., Trri the gates of which receive the erase check signal as described in the second embodiment. The row lines RL1, ..., RLi may be set at the initial threshold voltage, for example +1.5 V, of the memory cell. With this arrangement, the erase operation is properly stopped before each memory cell is converted to the memory cell of depletion type.

In the second embodiment, the data erase operation may be performed by alternately supplying the data erase voltage Ve and the erase check signal Vec. Furthermore, as described above, the row lines RL1, ..., RLi may be set at the initial threshold voltage of the memory cell through the MOS transistors Trr1, ..., Trri. With this arrangement, the erase operation may be interrupted without failure before respective memory cells are converted into depletion type.

What is claimed is:

1. A semiconductor memory device comprising:
   a memory matrix having a plurality of memory cells arranged in a matrix form, each of said plurality of memory cells including
   a semiconductor region of first conductivity type,
   a source region and a drain region of second conductivity type,
   an erase gate formed on said semiconductor region with a first insulating film interposed between said erase gate and said semiconductor region,
   a floating gate which is formed on said semiconductor region with a second insulating film being interposed between said floating gate and said semiconductor region, said floating gate being capable of storing data and overlapping said erase gate, and with a third insulating film being interposed between said floating gate and said erase gate, and
   a control gate which is formed on said floating gate with a fourth insulating film being interposed between said control gate and said floating gate and said control gate being insulated from said erase gate and said floating gate;
   a row line commonly connected to said control gates of said memory cells of each row of said memory matrix;
   a column line commonly connected to said sources or drains of said memory cells of each column of said memory matrix;
   an erase line commonly connected to said erase gates of said memory cells of each column of said memory matrix;
   first applying means for applying an erase voltage having a high level to said erase gate of said memory cell to erase data from said floating gate thereof, said memory cell being connected to said row line, said column line and said erase line which are selected;
   second applying means for applying a voltage of a predetermined level to said selected column line to detect a data erasure condition of said memory cells which is selected;
   means for inhibiting supply of said erase voltage when a current flowing through said column line is detected; and
   third applying means for applying a voltage of low level to said selected row line when data is erased and when data erasure is detected.

2. A semiconductor memory device according to claim 1, wherein data erasure and detection of data erasure are performed simultaneously.

3. A semiconductor memory device according to claim 1, wherein data erasure and detection of data erasure are alternately performed.

4. A semiconductor memory device according to claim 1, wherein said inhibiting means comprises:
   a plurality of sense amplifiers one end each of which is connected to said column line and the other end each of which is connected to each output end of a column decoder;
   a gate transistor arranged for each of said erase lines; and
   a booster connected to a gate of said gate transistor and to the output end of said column decoder.

5. A semiconductor memory device according to claim 4, wherein each of said sense amplifiers comprises:
   a first inverter circuit an input end of which is connected to the output end of said column decoder and an output end of which is connected to said column line, said first inverter circuit consisting of a series connection of an even number of inverters;
   a MOS transistor interposed between the output end of said column decoder and a point of ground potential;
   a second inverter circuit an input end of which is connected to said column line and which consists of a series connection of an odd number of inverters; and
   a latch circuit to which is input an output from said second inverter circuit and an output end of which is connected to a gate of said MOS transistor, a reset signal being input to said latch circuit in order to set the output end of said latch circuit at low level before initiating detection of data erase condition.

6. A semiconductor memory device according to claim 1, wherein said inhibiting means comprises:
   a sense amplifier having an input end which is connected to an input end of said column decoder and which is constituted by an odd number of inverters connected in series;
   a latch circuit having an input connected to an output from said sense amplifier, a reset signal being supplied to said latch circuit in order to set an output end of said latch circuit at a low level before initiating detection of data erasure condition;
   a first MOS transistor a gate of which is connected to the output end of said latch circuit and one end of which first MOS transistor is grounded; and
   a second MOS transistor which is arranged for each of said column lines and a gate of which is connected to the other end of said first MOS transistor.

* * * * *